United States Patent
Vellianitis

(10) Patent No.: US 9,252,217 B2
(45) Date of Patent: Feb. 2, 2016

(54) SEMICONDUCTOR ARRANGEMENT AND FORMATION THEREOF

(71) Applicant: Taiwan Semiconductor Manufacturing Company Limited, Hsin-Chu (TW)

(72) Inventor: Georgios Vellianitis, Heverlee (BE)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/289,911

(22) Filed: May 29, 2014

(65) Prior Publication Data

US 2015/0349059 A1  Dec. 3, 2015

(51) Int. Cl.
*H01L 21/00* (2006.01)
*H01L 29/10* (2006.01)
*H01L 29/786* (2006.01)
*H01L 29/423* (2006.01)
*H01L 29/66* (2006.01)
*H01L 21/22* (2006.01)
*H01L 21/36* (2006.01)
*H01L 21/20* (2006.01)
*H01L 21/02* (2006.01)
*H01L 21/203* (2006.01)

(52) U.S. Cl.
CPC ...... *H01L 29/1054* (2013.01); *H01L 21/02293* (2013.01); *H01L 21/20* (2013.01); *H01L 21/2022* (2013.01); *H01L 21/2033* (2013.01); *H01L 21/2205* (2013.01); *H01L 21/36* (2013.01); *H01L 29/42392* (2013.01); *H01L 29/66666* (2013.01); *H01L 29/78642* (2013.01)

(58) Field of Classification Search
CPC . H01L 21/20; H01L 21/2022; H01L 21/2205; H01L 21/02293; H01L 21/2033; H01L 21/36
See application file for complete search history.

(56) References Cited

U.S. PATENT DOCUMENTS

| | | | | |
|---|---|---|---|---|
| 6,784,467 | B1 * | 8/2004 | Kalburge | H01L 29/0804 257/197 |
| 7,569,480 | B2 * | 8/2009 | Liu | H01L 21/26506 438/585 |
| 2007/0238253 | A1 * | 10/2007 | Tucker | H01L 21/046 438/289 |
| 2011/0086498 | A1 * | 4/2011 | Cheng | B82Y 10/00 438/488 |
| 2013/0105885 | A1 * | 5/2013 | Flachowsky | H01L 29/78 257/330 |
| 2014/0374805 | A1 * | 12/2014 | Wu | H01L 21/311 257/288 |

* cited by examiner

*Primary Examiner* — Ngan Ngo
(74) *Attorney, Agent, or Firm* — Cooper Legal Group, LLC

(57) ABSTRACT

A semiconductor arrangement and method of formation are provided. The semiconductor arrangement includes a semiconductor column having a first portion comprising a first material, a second portion comprising a second material, and a third portion comprising a third material, where the second material is different than the first material and the third material. The first portion, the second portion, and the third portion have substantially equal widths. A first abrupt interface exists between a top surface of the first portion and a bottom surface of the second portion, and a second abrupt interface exists between a top surface of the second portion and a bottom surface of the third portion, in an embodiment. In an embodiment, the column forms part of a transistor where the first portions functions as a source or drain, the second portion functions as a channel, and the third portion functions as a drain or source.

20 Claims, 6 Drawing Sheets

SEMICONDUCTOR ARRANGEMENT AND FORMATION THEREOF

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
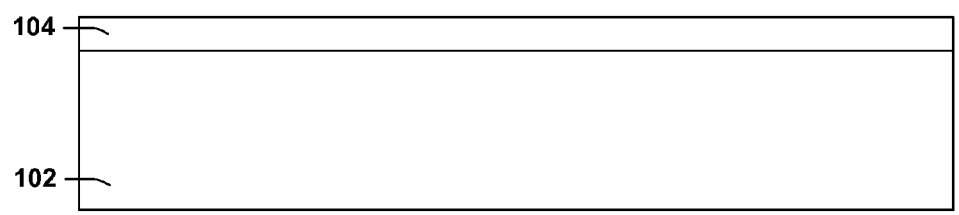
FIG. 1 is an illustration of a semiconductor arrangement at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

According to some embodiments, a semiconductor arrangement comprises a semiconductor column on a substrate. In some embodiments, the semiconductor column comprises a first portion comprising a first material in contact with the substrate. In some embodiments, the semiconductor column comprises a second portion comprising a second material over the first portion. In some embodiments, the first portion and the second portion have substantially equal widths. In some embodiments, a first abrupt interface exists between the first portion and the second portion such that little to none of the first material is in the second portion and little to none of the second material is in the first portion. In some embodiments, the abrupt interface provides that a bottom surface of the second portion comprises less than one percent of the first material and a top surface of the first portion comprises less than one percent of the second material.

In some embodiments, the semiconductor column comprises a third portion comprising a third material over the second portion. In some embodiments, the second portion and the third portion have substantially equal widths. In some embodiments, a second abrupt interface exists between the second portion and the third portion such that little to none of the second material is in the third portion and little to none of the third material is in the second portion. In some embodiments, the abrupt interface provides that a bottom surface of the third portion comprises less than one percent of the second material and a top surface of the second portion comprises less than one percent of the third material.

According to some embodiments, a method of forming a semiconductor arrangement comprises forming a first opening in a first dielectric layer. In some embodiments, the first dielectric layer is over the substrate. In some embodiments, the first portion of the semiconductor column is formed in the first opening. In some embodiments, the first portion comprises the first material. In some embodiments, the first portion is grown absent at least one of a metal seed layer, a catalyst, etc. In some embodiments, the first portion has a first portion width substantially equal to a first opening width of the first opening. In some embodiments, a second dielectric layer is formed around the first portion. In some embodiments, a top surface of the second dielectric layer is at least one of even with or above the top surface of the first portion.

According to some embodiments, the second portion of the semiconductor column is formed over the first portion. In some embodiments, the second portion comprises the second material. In some embodiments, the second portion is grown. In some embodiments, the bottom surface of the second portion comprises less than one percent of the first material and the top surface of the first portion comprises less than one percent of the second material. In some embodiments, such as when the top surface of the second dielectric layer is above the top surface of the first portion, a second opening is defined in the second dielectric layer above the first portion. In some embodiments, the second opening has a second opening width substantially equal to the first opening width. In some embodiments, the second portion has a second portion width substantially equal to the first portion width. In some embodiments, a third dielectric layer is formed around the second portion, such that a top surface of the third dielectric layer is at least one of even with or above the top surface of the second portion.

According to some embodiments, the third portion of the semiconductor column is formed over the second portion. In some embodiments, the third portion comprises the third material. In some embodiments, the third portion is grown. In some embodiments, the bottom surface of the third portion comprises less than one percent of the second material and the top surface of the second portion comprises less than one percent of the third material. In some embodiments, such as when the top surface of the third dielectric layer is above the top surface of the second portion, a third opening is defined in the third dielectric layer above the second portion. In some embodiments, the third opening has a third opening width substantially equal to the second opening width. In some embodiments, the third portion has a third portion width substantially equal to the second portion width.

According to some embodiments, the first dielectric layer limits or confines radial or lateral growth of the first portion, such that the first portion grows along a column axis of the semiconductor column and the first portion width does not exceed the first opening width. In some embodiments, the first dielectric layer negates a requirement for at least one of a metal seed, a catalyst, etc. In some embodiments, forming the second portion over the first portion absent at least one of a metal seed, a catalyst, etc, reduces intermingling between the first material of the first portion and the second material of the second portion, thus yielding the second abrupt interface. In some embodiments, absent a metal seed, a catalyst, etc., the second portion is grown such that as an initial monolayer of the second material is formed over the top surface of the first portion, little to none of the first material is in the initial monolayer of the second material. In some embodiments, the second dielectric layer limits or confines radial or lateral growth of the second portion, such that the second portion grows along the column axis of the semiconductor column and the second portion width does not exceed the second opening width. In some embodiments, at least one of the first dielectric layer or the second dielectric layer controls radial growth of the second portion, such that little to none of the second material forms on sidewalls of the first portion.

According to some embodiments, forming the third portion over the second portion absent at least one of a metal seed, a catalyst, etc., reduces intermingling between the second material of the second portion and the third material of the third portion, thus yielding the second abrupt interface. In some embodiments, absent the at least one of a metal seed, a catalyst, etc., the third portion is grown such that as an initial monolayer of the third material is formed over the top surface of the second portion, little to none of the second material is in the initial monolayer of the third material. In some embodiments, the third dielectric layer limits or confines radial or lateral growth of the third portion, such that the third portion grows along the column axis of the semiconductor column and the third portion width does not exceed the third opening width. In some embodiments, at least one of the second dielectric layer or the third dielectric layer controls radial growth of the third portion, such that little to none of the third material forms on sidewalls of the second portion. In some embodiments, the reduction of intermingling between at least one of the first material and the second material, or the second material and the third material reduces an energy of a Schottky barrier between at least one of the first portion and the second portion, or the second portion and the third portion. In some embodiments, a well-defined or abrupt interface, such as through at least one of the top surface of the first portion and the bottom surface of the second portion, or the top surface of the second portion and the bottom surface of the third portion, reduces an energy of a Schottky barrier, as compared to a poorly defined interface.

FIGS. 1-11 are cross-sectional views of a semiconductor arrangement 100, according to some embodiments, at various stages of fabrication. Turning to FIG. 1, a first dielectric layer 104 is formed over a substrate 102, according to some embodiments. In some embodiments, the substrate 102 includes at least one of an epitaxial layer, a silicon-on-insulator (SOI) structure, a wafer, or a die formed from a wafer. In some embodiments, the substrate 102 comprises at least one of silicon, carbon, etc. In some embodiments, the first dielectric layer 104 is formed by at least one of growth or deposition. In some embodiments, the first dielectric layer 104 is formed by at least one of physical vapor deposition (PVD), chemical vapor deposition (CVD), or atomic layer deposition (ALD). In some embodiments, the first dielectric layer 104 comprises an oxide, a nitride, etc.

Figure 2:
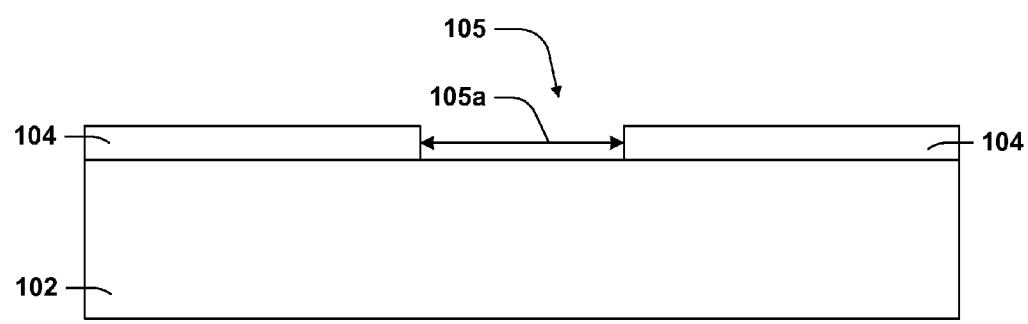
FIG. 2 is an illustration of a semiconductor arrangement at a stage of fabrication, in accordance with some embodiments.

Turning to FIG. 2, a first opening 105 is formed in the first dielectric layer 104, according to some embodiments. In some embodiments, the first opening 105 is formed by etching. In some embodiments, the first opening 105 is formed using a first mask. In some embodiments, the first opening 105 exposes at least some of the substrate 102. In some embodiments, the first opening 105 has a first opening width 105a. In some embodiments, the first opening width 105a is between about 5 nm to about 100 nm. In some embodiments, a surface clean is performed on the semiconductor arrangement 100 at least one of before or after the first opening 105a is formed. In some embodiments, the surface clean is performed in a metal-organic chemical vapor deposition (MOCVD) chamber. In some embodiments, the surface clean comprises at least one of applying a wet chemical solution, such as a hydrogen fluorine solution, to the semiconductor arrangement 100, or applying a hydrogen solution at a temperature between about 700° C. to about 850° C. for a duration between about 5 min to about 20 min. In some embodiment, a surface conditioning is performed after the surface clean. In some embodiments, the surface conditioning comprises applying a hydrogen solution at a conditioning temperature between about 350° C. to about 450° C. In some embodiments, the surface conditioning comprises applying a conditioning solution comprising tertiarybutylarsine (TBA) at a conditioning flow rate between about 100 μmol/min to about 600 μmol/min.

Figure 3:
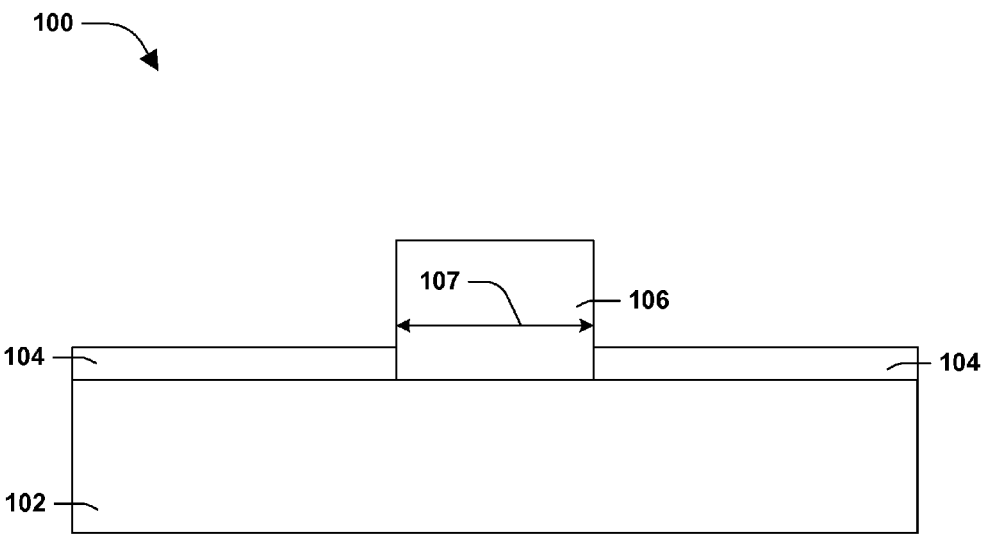
FIG. 3 is an illustration of a semiconductor arrangement at a stage of fabrication, in accordance with some embodiments.

Turning to FIG. 3, a first portion 106 is formed in the first opening 105, according to some embodiments. In some embodiments, the first portion 106 comprises a first material. In some embodiments, the first portion 106 is grown. In some embodiments, the first portion 106 is grown by increasing the conditioning temperature to a growth temperature between about 500° C. to about 600° C. over a temperature duration between about 100 s to 300 s. In some embodiments, the first portion 106 is grown at a growth pressure between about 50 torr to about 250 torr. In some embodiments, the first portion 106 is grown by applying a gaseous precursor of at least one of germanium, silicon, a group III element, a group V element, etc. In some embodiments, the first material comprises at least one of germanium, silicon, a group III element, a group V element, etc. In some embodiments, the first portion 106 comprises at least one of a source or a drain. In some embodiments, the first portion 106 has a first portion height between about 5 nm to about 100 nm. In some embodiments, the first portion 106 has a first portion width 107 substantially equal to the first opening width 105a.

Figure 4:
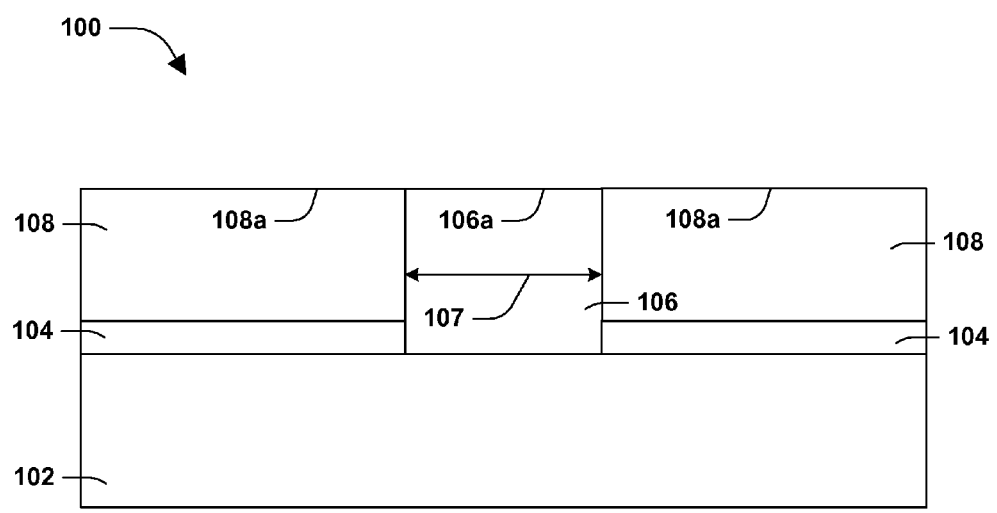
FIG. 4 is an illustration of a semiconductor arrangement at a stage of fabrication, in accordance with some embodiments.

Turning to FIG. 4, a second dielectric layer 108 is formed over the first dielectric layer 104 and the first portion 106, according to some embodiments. In some embodiments, a first chemical mechanical planarization (CMP) is performed to expose a top surface 106a of the first portion 106. In some embodiments, after the first CMP is performed the top surface 106a of the first portion 106 is substantially even or flush with a top surface 108a of the second dielectric layer 108.

Figure 5:
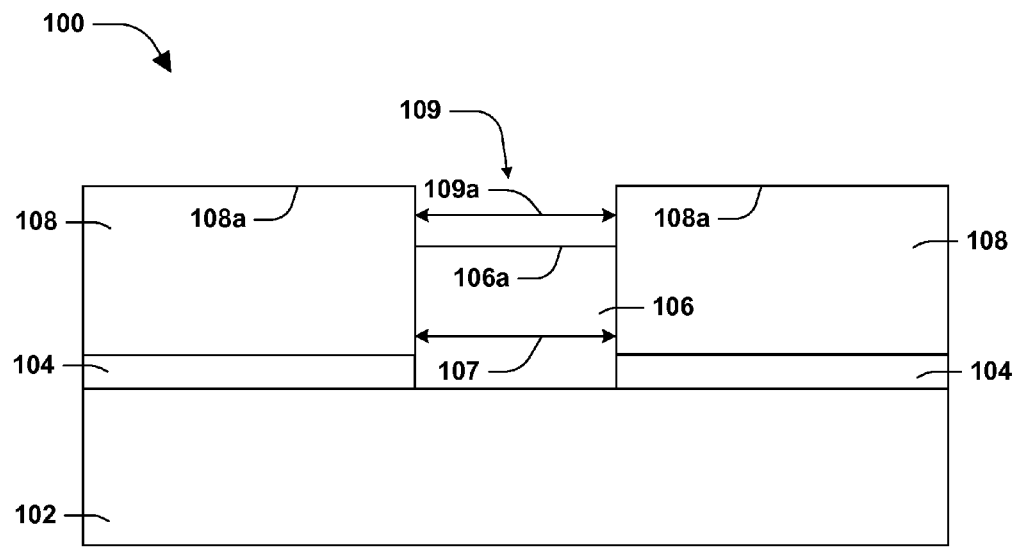
FIG. 5 is an illustration of a semiconductor arrangement at a stage of fabrication, in accordance with some embodiments.

Turning to FIG. 5, the first portion 106 is recessed, such that the top surface 106a of the first portion 106 is lower than the top surface 108a of the second dielectric layer 108, according to some embodiments. In some embodiments, the first portion 106 is not recessed. In some embodiments, the first portion 106 is recessed by etching. In some embodiments, recessing the first portion 106 forms a second opening 109 defined in the second dielectric layer 108 above the first portion 106. In some embodiments, the second opening 109 is formed using the first mask used to form the first opening 105. In some embodiments, the second opening 109 has a second opening width 109a substantially equal to the first opening width 105a.

Figure 6:
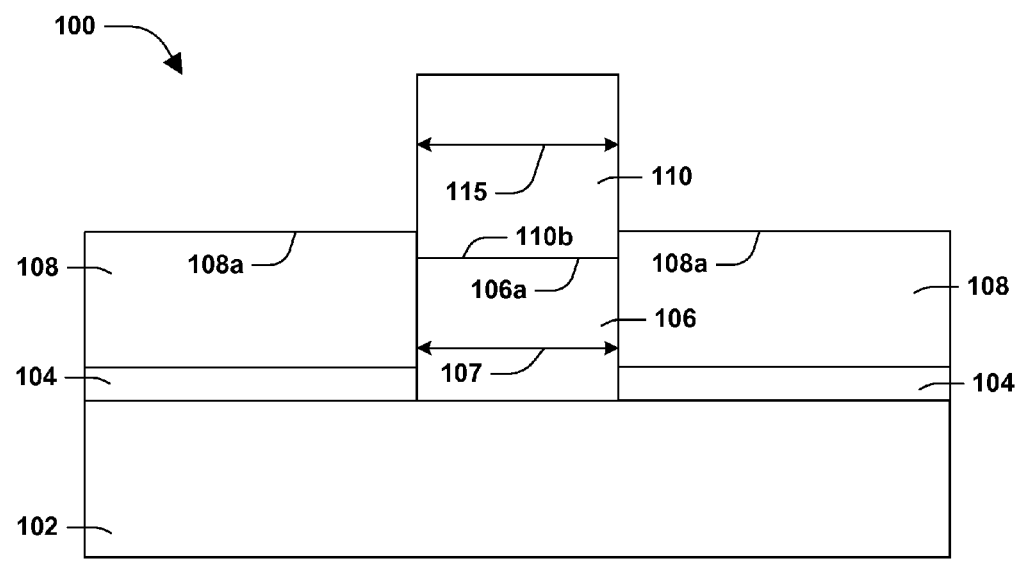
FIG. 6 is an illustration of a semiconductor arrangement at a stage of fabrication, in accordance with some embodiments.

Turning to FIG. 6, regardless of whether the first portion is recessed, a second portion 110 is formed on the top surface 106a of the first portion 106. In some embodiments, the second portion 110 comprises a second material. In some embodiments, the second portion 110 is grown. In some embodiments, the second portion 110 is grown at the growth temperature. In some embodiments, the second portion 110 is grown at the growth pressure. In some embodiments, the second portion 110 is grown by applying a gaseous precursor of at least one of germanium, silicon, a group III element, a group V element, etc. In some embodiments, the second material comprising at least one of germanium, silicon, a group III element, a group V element, etc. In some embodiments, the first material and the second material comprise different materials. In some embodiments, the second portion 110 comprises a channel. In some embodiments, the second portion 110 has a second portion height between about 5 nm to about 100 nm. In some embodiments, the second portion 110 has a second portion width 115 substantially equal to the first portion width 107. In some embodiments, a bottom surface 110b of the second portion 110 comprises less than one percent of the first material and the top surface 106a of the first portion 106 comprises less than one percent of the second material. In some embodiments, the second portion 110 is grown, such that as an initial monolayer of the second material is formed over the top surface 106a of the first portion 106, little to none of the first material is in the initial monolayer of the second material. According to some embodiments, a first abrupt interface thereby exists between the first portion and the second portion.

Figure 7:
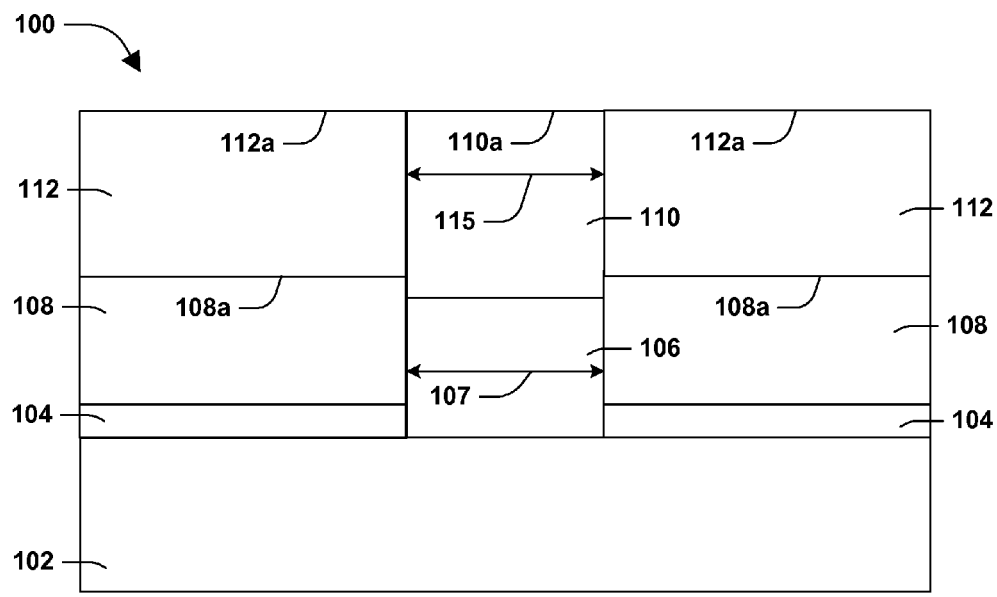
FIG. 7 is an illustration of a semiconductor arrangement at a stage of fabrication, in accordance with some embodiments.

Turning to FIG. 7, a third dielectric layer 112 is formed over the second dielectric layer 108 and the second portion 110, according to some embodiments. In some embodiments, a second CMP is performed to expose a top surface 110a of the second portion 110. In some embodiments, after the second CMP is performed the top surface 110a of the second portion 110 is substantially even or flush with a top surface 112a of the third dielectric layer 112.

Figure 8:
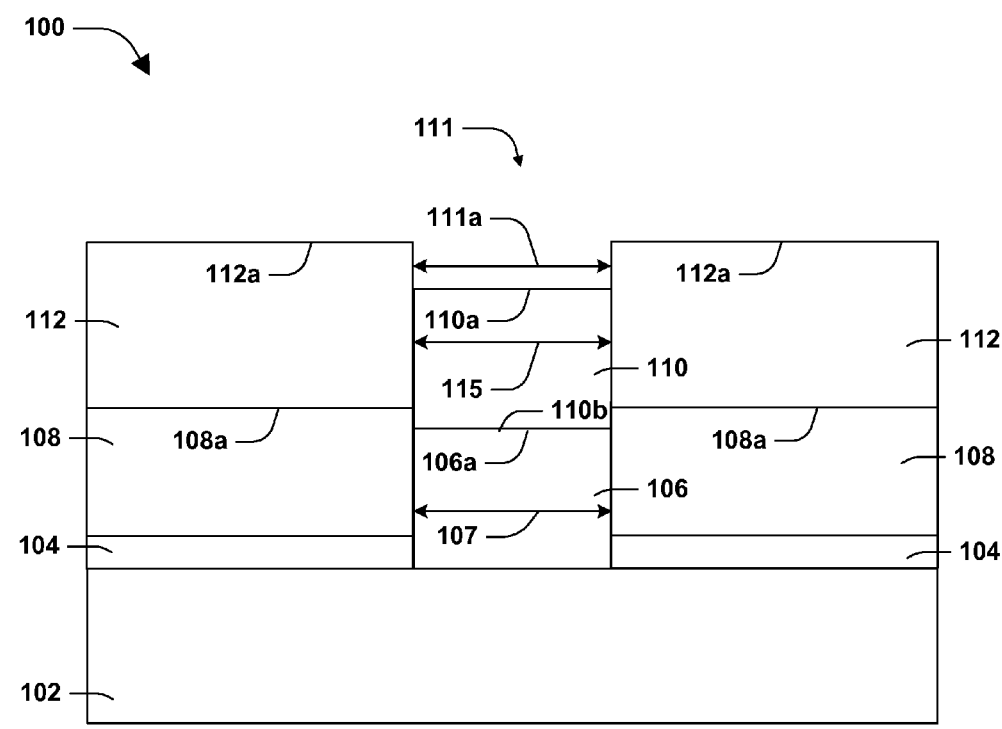
FIG. 8 is an illustration of a semiconductor arrangement at a stage of fabrication, in accordance with some embodiments.

Turning to FIG. 8, the second portion 110 is recessed, such that the top surface 110a of the second portion 110 is lower than the top surface 112a of the third dielectric layer 112, according to some embodiments. In some embodiments, the second portion 110 is not recessed. In some embodiments, the second portion 110 is recessed by etching. In some embodiments, the second portion 110 is recessed using the first mask used to form the first opening 105 and the second opening 109. In some embodiments, recessing the second portion 110 forms a third opening 111 defined in the third dielectric layer 112 above the second portion 110. In some embodiments, the third opening 111 has a third opening width 111a substantially equal to the first opening width 105a.

Figure 9:
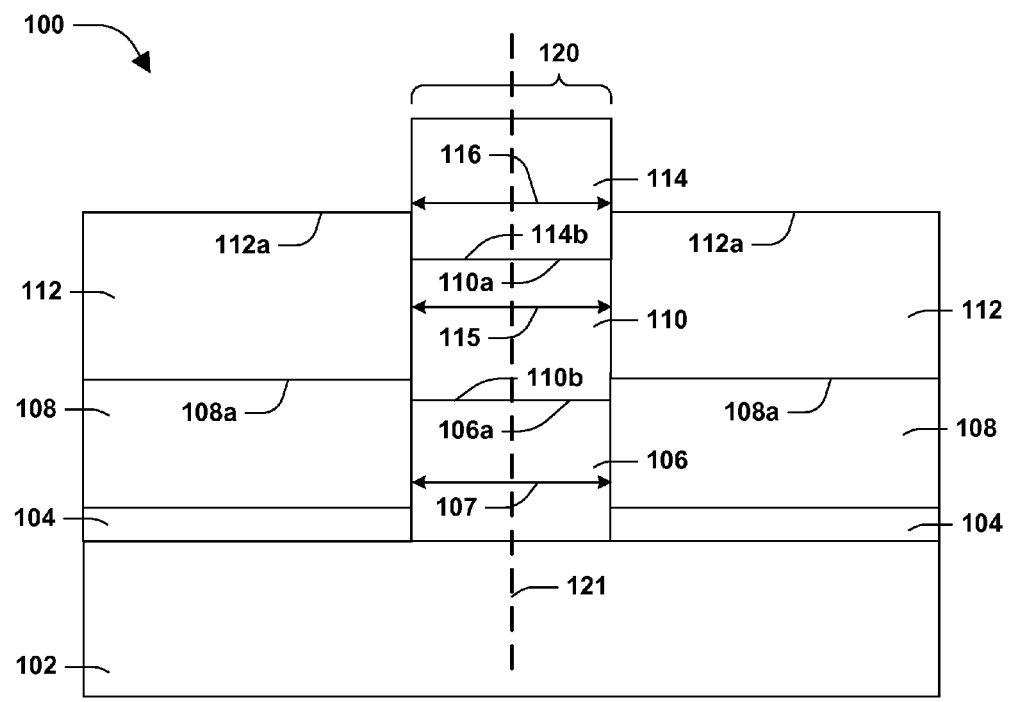
FIG. 9 is an illustration of a semiconductor arrangement at a stage of fabrication, in accordance with some embodiments.

Turning to FIG. 9, regardless of whether the second portion is recessed, a third portion 114 is formed on the top surface 110a of the second portion 110. In some embodiments, the third portion 114 comprises a third material. In some embodiments, the third portion 114 is grown. In some embodiments, the third portion 114 is grown at the growth temperature. In some embodiments, the third portion 114 is grown at the growth pressure. In some embodiments, the third portion 114 is grown by applying a gaseous precursor of at least one of germanium, silicon, a group III element, a group V element, etc. In some embodiments, the third material comprising at least one of germanium, silicon, a group III element, a group V element, etc. In some embodiments, the third material and the second material comprise different materials. In some embodiments, the third material and the first material comprise a same material. In some embodiments, the third portion 114 comprises at least one of a source or a drain. In some embodiments, the third portion 114 has a third portion height between about 5 nm to about 100 nm. In some embodiments, the third portion 114 has a third portion width 116 substantially equal to the second portion width 115. In some embodiments, a bottom surface 114b of the third portion 114 comprises less than one percent of the second material and the top surface 110a of the second portion 110 comprises less than one percent of the third material. In some embodiments, the third portion 114 is grown such that as an initial monolayer of the third material is formed over the top surface 110a of the second portion 110, little to none of the second material is in the initial monolayer of the third material. According to some embodiments, a second abrupt interface thereby exists between the second portion and the third portion. In some embodiments, the first portion 106, the second portion 110, and the third portion 114 form a semiconductor column 120 that extends along a column axis 121 of the semiconductor column.

Figure 10:
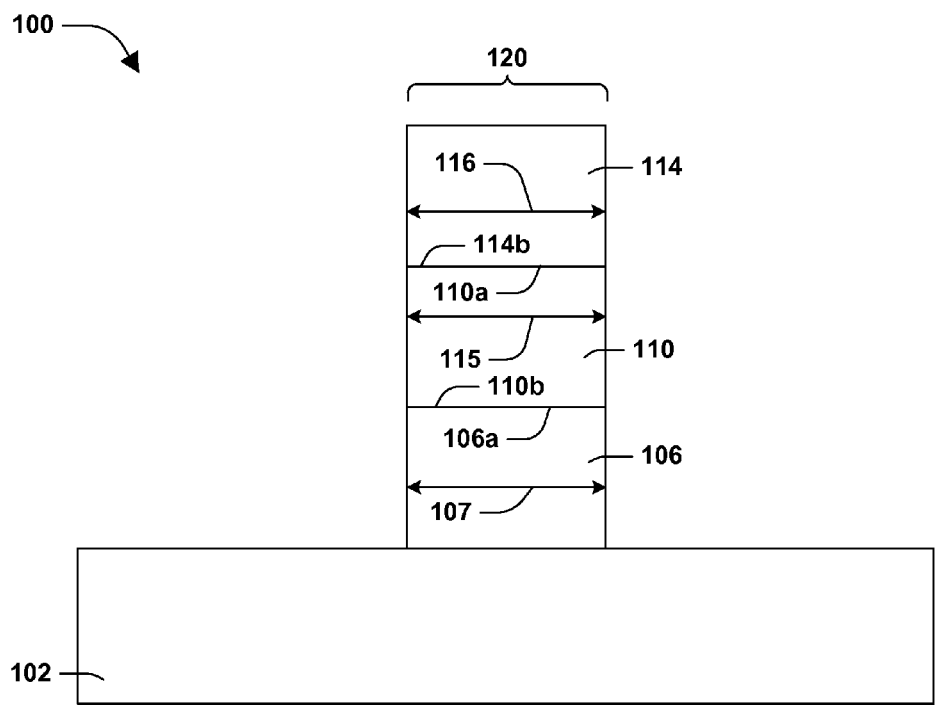
FIG. 10 is an illustration of a semiconductor arrangement at a stage of fabrication, in accordance with some embodiments.

Turning to FIG. 10, at least one of the first dielectric layer 104, the second dielectric layer 108, or the third dielectric layer 112 is removed, according to some embodiments. In some embodiments, at least one of the first dielectric layer 104, the second dielectric layer 108, or the third dielectric layer 112 is removed by etching.

Figure 11:
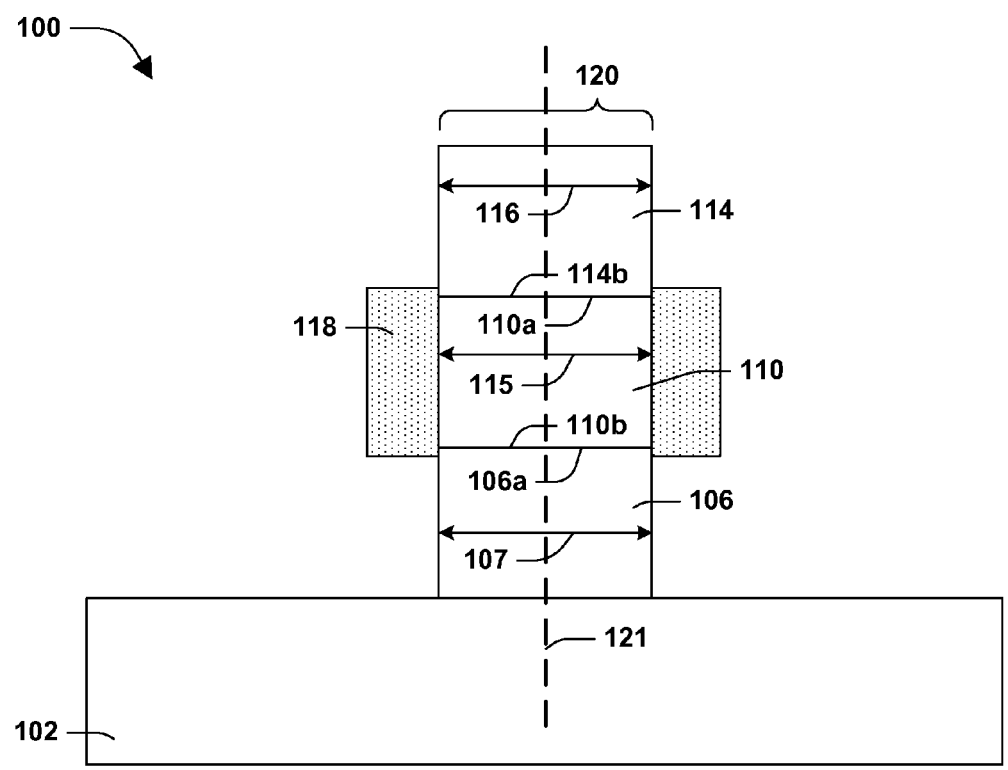
FIG. 11 is an illustration of a semiconductor arrangement at a stage of fabrication, in accordance with some embodiments.

Turning to FIG. 11, a gate 118 is formed around at least some of at least one of the first portion 106, the second portion 110, or at least some of the third portion 114, according to some embodiments. In some embodiments, the semiconductor column 120 comprises a transistor. In some embodiments, the gate 118 comprises a gate dielectric in direct contact with a sidewall of the semiconductor column 120. In some embodiments, the gate 118 comprises a gate electrode surrounding a gate dielectric, where the gate dielectric is disposed between the gate electrode and the semiconductor column 120.

According to some embodiments, the first dielectric layer 104 limits or constrains radial or lateral growth of the first portion 106 in a direction perpendicular to the column axis 121, such that the first portion 106 grows along the column axis 121 and the first portion width 107 does not exceed the first opening width 105a. In some embodiments, the first dielectric layer 104 negates a requirement for at least one of a metal seed, a catalyst, etc. In some embodiments, forming the second portion 110 over the first portion 106 absent at least one of a metal seed, a catalyst, etc, reduces intermingling between the first material of the first portion 106 and the second material of the second portion 110. In some embodiments, absent at least one of a metal seed, a catalyst, etc., the second portion 110 is grown such that as the initial monolayer of the second material is formed over the top surface 106a of the first portion 106 little to none of the first material is in the initial monolayer of the second material.

In some embodiments, the second dielectric layer 108 limits or constrains radial or lateral growth of the second portion 110 in a direction perpendicular to the column axis 121, such that the second portion 110 grows along the column axis 121 and the second portion width 115 does not exceed the second opening width 109a. In some embodiments, at least one of the first dielectric layer 104 or the second dielectric layer 108 controls radial growth of the second portion 110, such that little to none of the second material forms on sidewalls of the first portion 106.

In some embodiments, at least one of the first dielectric layer 104 or the second dielectric layer 108 negates a requirement for at least one of a metal seed, a catalyst, etc. According to some embodiments, forming the third portion 114 over the second portion 110 absent at least one of a metal seed, a catalyst, etc, reduces intermingling between the second material of the second portion 110 and the third material of the third portion 114. In some embodiments, absent at least one of a metal seed, a catalyst, etc., the third portion 114 is grown such that as the initial monolayer of the third material is formed over the top surface 110a of the second portion 110 little to none of the second material is in the initial monolayer of the third material.

In some embodiments, the third dielectric layer 112 limits or constrains radial or lateral growth of the third portion 114 in a direction perpendicular to the column axis 121, such that the third portion 114 grows along the column axis 121 and the third portion width 116 does not exceed the third opening width 111a. In some embodiments, at least one of the second dielectric layer 108 or the third dielectric layer 112 controls radial growth of the third portion 114, such that little to none of the third material forms on sidewalls of the second portion 110.

In some embodiments, the reduction of intermingling between at least one of the first material and the second material, or the second material and the third material reduces an energy of a Schottky barrier between at least one of the first portion 106 and the second portion 110, or the second portion 110 and the third portion 114. In some embodiments, a well-defined or abrupt interface, such as through at least one of the top surface 106a of the first portion 106 and the bottom surface 110b of the second portion 110, or the top surface 110a of the second portion 110 and the bottom surface 114b of the third portion 114 reduces an energy of a Schottky barrier, as compared to a poorly defined interface.

According to some embodiments, a method of forming a semiconductor arrangement, comprises forming a first opening in a first dielectric layer, the first dielectric layer over a substrate and forming a first portion of a semiconductor column in the first opening, the first portion comprising a first material. According to some embodiments, the method of forming a semiconductor arrangement, comprises forming a second dielectric layer around the first portion, such that a top surface of the second dielectric layer is at least one of even with or above a top surface of the first portion and forming a second portion of the semiconductor column over the first portion, the second portion comprising a second material, where a bottom surface of the second portion comprises less than one percent of the first material and the top surface of the first portion comprises less than one percent of the second material. According to some embodiments, the method of forming a semiconductor arrangement forming a third dielectric layer around the second portion, such that a top surface of the third dielectric layer is at least one of even with or above a top surface of the second portion and forming a third portion of the semiconductor column over the second portion, the third portion comprising a third material, where a bottom surface of the third portion comprises less than one percent of the second material and the top surface of the second portion comprises less than one percent of the third material.

According to some embodiments, a semiconductor arrangement comprises a semiconductor column on a substrate. In some embodiments, the semiconductor column comprises a first portion comprising a first material in contact with the substrate and a second portion comprising a second material over the first portion. In some embodiments, the first portion and the second portion have a substantially equal width, where a bottom surface of the second portion comprises less than one percent of the first material and a top surface of the first portion comprises less than one percent of the second material. In some embodiments, the semiconductor column comprises a third portion comprising a third material over the second portion. In some embodiments, the second portion and the third portion having a substantially equal width, where a bottom surface of the third portion comprises less than one percent of the second material and a top surface of the second portion comprises less than one percent of the third material.

According to some embodiments, a method of forming a semiconductor arrangement, comprises forming a first opening having a first opening width in a first dielectric layer, the first dielectric layer over a substrate and forming a first portion of a semiconductor column in the first opening, the first portion comprising a first material, the first portion having a first portion width substantially equal to the first opening width. According to some embodiments, the method of forming a semiconductor arrangement, comprises forming a second dielectric layer around the first portion, such that a top surface of the second dielectric layer is above a top surface of the first portion and a second opening is defined in the second dielectric layer above the first portion, where the second opening has a second opening width substantially equal to the first opening width and forming a second portion of the semiconductor column over the first portion in the second opening, the second portion comprising a second material different than the first material, the second portion having a second portion width substantially equal to the first opening width.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as etching techniques, planarization techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
    forming a first opening in a first dielectric layer, the first dielectric layer over a substrate;
    forming a first portion of a semiconductor column in the first opening, the first portion comprising a first material;
    forming a second dielectric layer around the first portion, such that a top surface of the second dielectric layer is at least one of even with or above a top surface of the first portion;
    forming a second portion of the semiconductor column over the first portion, the second portion comprising a second material, where a bottom surface of the second portion comprises less than one percent of the first material and the top surface of the first portion comprises less than one percent of the second material;
    forming a third dielectric layer around the second portion, such that a top surface of the third dielectric layer is at least one of even with or above a top surface of the second portion; and
    forming a third portion of the semiconductor column over the second portion, the third portion comprising a third material, where a bottom surface of the third portion comprises less than one percent of the second material and the top surface of the second portion comprises less than one percent of the third material.

2. The method of claim 1, the forming a first portion comprising growing the first material in the first opening.

3. The method of claim 1, the forming a second portion comprising growing the second material on the first portion.

4. The method of claim 1, the forming a third portion comprising growing the third material on the second portion.

5. The method of claim 1, comprising forming a gate around the second portion of the semiconductor column.

6. The method of claim 1, the forming a first opening comprising etching the first dielectric layer such that the first opening has a first opening width, and the forming a second portion comprising forming the second portion such that the second portion has a second portion width substantially equal to the first opening width.

7. The method of claim 1, comprising performing chemical mechanical planarization (CMP) on the first portion and the second dielectric layer prior to the forming a second portion.

8. The method of claim 1, comprising recessing the first portion prior to the forming a second portion.

9. The method of claim 1, comprising performing chemical mechanical planarization (CMP) on the second portion and the third dielectric layer prior to the forming a third portion.

10. The method of claim 1, comprising recessing the second portion prior to the forming a third portion.

11. A method of forming a semiconductor arrangement, comprising:
    forming a first opening having a first opening width in a first dielectric layer, the first dielectric layer over a substrate;
    forming a first portion of a semiconductor column in the first opening, the first portion comprising a first material, the first portion having a first portion width substantially equal to the first opening width;
    forming a second dielectric layer around the first portion, such that a top surface of the second dielectric layer is above a top surface of the first portion and a second opening is defined in the second dielectric layer above the first portion, where the second opening has a second opening width substantially equal to the first opening width; and
    forming a second portion of the semiconductor column over the first portion in the second opening, the second portion comprising a second material different than the first material, the second portion having a second portion width substantially equal to the first opening width.

12. The method of claim 11, comprising:
forming a third dielectric layer around the second portion, such that a top surface of the third dielectric layer is at least one of even with or above a top surface of the second portion;
forming a third portion of the semiconductor column over the second portion, the third portion comprising a third material different than the second material; and
forming a gate around the second portion of the semiconductor column.

13. The method of claim 11, the forming a first opening comprising etching the first dielectric layer such that the first opening width is between about 5 nm to about 100 nm.

14. The method of claim 11, comprising performing chemical mechanical planarization (CMP) on the first portion and the second dielectric layer prior to the forming a second portion.

15. The method of claim 11, comprising recessing the first portion prior to the forming a second portion.

16. A method of forming a semiconductor arrangement, comprising:
forming a first opening in a first dielectric layer, the first opening defined by a sidewall of the first dielectric layer;
growing a source/drain region in the first opening, wherein a sidewall of the first dielectric layer constrains radial growth of the source/drain region;
forming a second dielectric layer around a portion of the source/drain region extending above a top surface of the first dielectric layer;
removing a portion of the source/drain region to form a second opening, the second opening defined by a sidewall of the second dielectric layer; and
growing a channel region in the second opening, wherein the sidewall of the second dielectric layer constrains radial growth of the channel region.

17. The method of claim 16, comprising:
forming a third dielectric layer around a portion of the channel region extending above a top surface of the second dielectric layer;
removing a portion of the channel region to form a third opening, the third opening defined by a sidewall of the third dielectric layer; and
growing a second source/drain region in the third opening, wherein the sidewall of the third dielectric layer constrains radial growth of the second source/drain region.

18. The method of claim 16, the growing a source/drain region comprising:
applying a gaseous precursor to the first opening.

19. The method of claim 16, the growing a source/drain region comprising:
growing the source/drain region without using a metal catalyst.

20. The method of claim 16, comprising, before removing a portion of the source/drain region:
planarizing the second dielectric layer to expose a top surface of the source/drain region.

* * * * *